(12) United States Patent
Zeilinger et al.

(10) Patent No.: US 6,432,569 B1
(45) Date of Patent: Aug. 13, 2002

(54) METHOD AND APPARATUS FOR MONITORING A SELECTED GROUP OF FUEL CELLS OF A HIGH-TEMPERATURE FUEL CELL STACK

(75) Inventors: Reinhold Zeilinger, Gutenstetten; Walter Stühler, Hirschaid; Martin Keim, Möhrendorf, all of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/197,370

(22) Filed: Nov. 20, 1998

(30) Foreign Application Priority Data

Nov. 20, 1997 (EP) .............................................. 97120389

(51) Int. Cl.$^7$ ................................................ H01M 8/04
(52) U.S. Cl. .......................................... 429/23; 324/434
(58) Field of Search ................................ 324/433, 434; 340/636; 429/23

(56) References Cited

U.S. PATENT DOCUMENTS

| | | | | |
|---|---|---|---|---|
| 3,808,534 A | * | 4/1974 | Summers et al. | 340/433 |
| 4,198,597 A | * | 4/1980 | Sawyer | 324/434 |
| 4,424,491 A | * | 1/1984 | Bubbett et al. | 324/433 |
| 5,170,124 A | * | 12/1992 | Blair et al. | 324/434 |

FOREIGN PATENT DOCUMENTS

| | | |
|---|---|---|
| DE | 4338178 * | 5/1995 |
| DE | 195 23 260 A1 | 3/1997 |
| EP | 0 486 654 B1 | 5/1992 |

OTHER PUBLICATIONS

Translation of Japanese published application 09–245826, Ueno et al. dated Sep. 19, 1997.*
International Patent Application No. 91/19328 (Blair et al.), dated Dec. 12, 1991.
Japanese Patent Abstract No. 63126172 (Takeu Toshihiko), dated May 30, 1988.
Japanese Patent Abstract No. 62271357 (Kanao Elji), dated Nov. 25, 1987.
Japanese Patent Abstract No. 9–245826, dated Feb. 29, 1996.
Japanese Patent Abstract No. 06243882 (Ujiie Takashi), dated Nov. 2, 1994.
Japanese Patent Abstract No. 08315844 (Iwashita Sakae), dated Nov. 29, 1996.
Japanese Patent Abstract No. 61091877 (Tokuno Masatoshi), dated May 9, 1986.
A. J. Appleby/F. R. Foulkes: "Fuel Cell Handbook", Van Nostrand Reinhold 1989, ISBN 0–442–31926–6, pp. 440 to 454 (month not applicable).

* cited by examiner

Primary Examiner—Stephen Kalafut
(74) Attorney, Agent, or Firm—Laurence A. Greenberg; Werner H. Stemer; Gregory L. Mayback

(57) ABSTRACT

In a method and an apparatus for monitoring a selected group of fuel cells of a high-temperature fuel cell stack, a change over time in an averaged electrical voltage of the fuel cells of the selected group is ascertained and compared with a reference value that detects at least a change over time in a voltage of other fuel cells. The method permits a reliable detection of the failure of one fuel cell of a stack with simple measures.

15 Claims, 1 Drawing Sheet

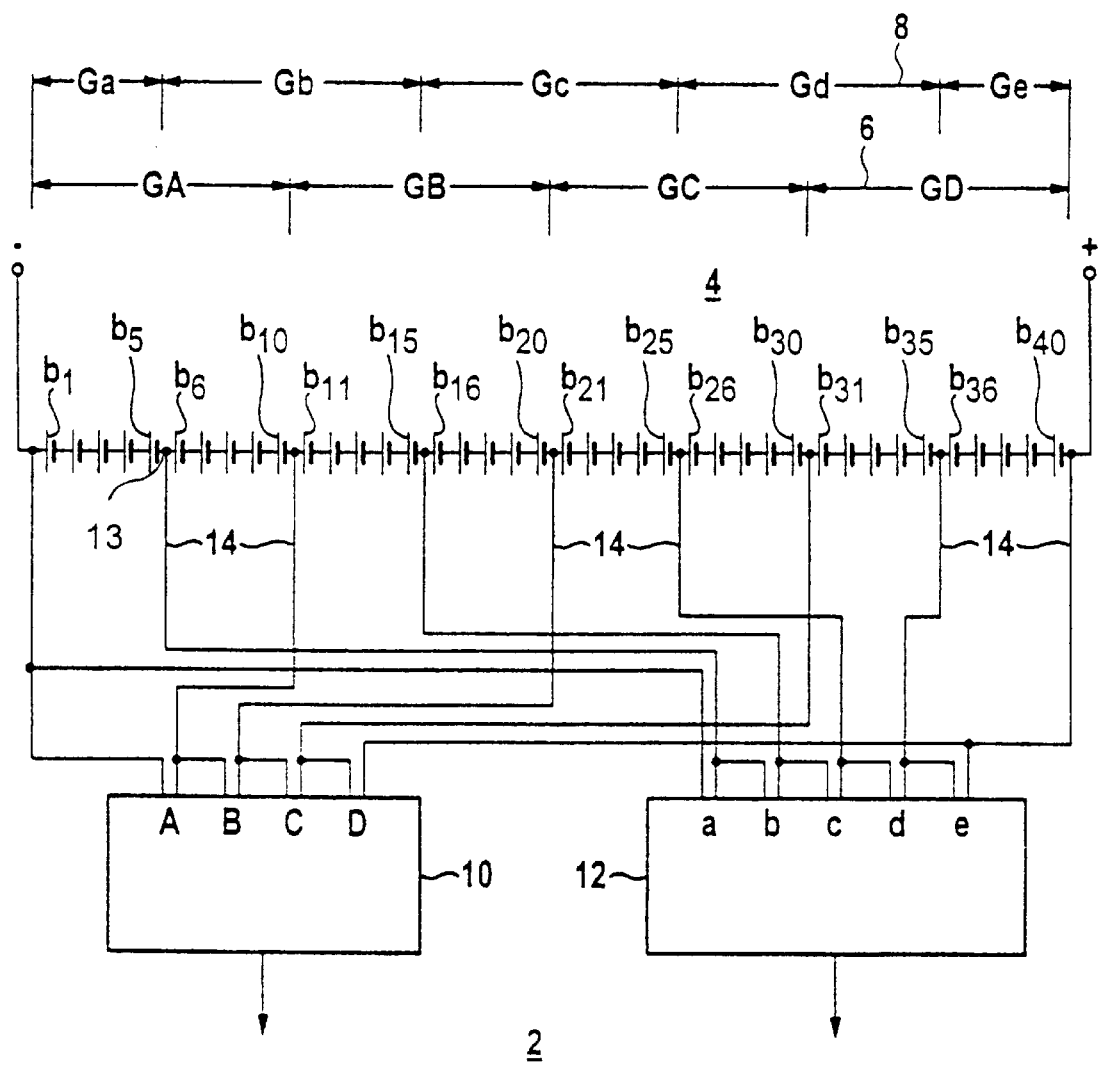

METHOD AND APPARATUS FOR MONITORING A SELECTED GROUP OF FUEL CELLS OF A HIGH-TEMPERATURE FUEL CELL STACK

BACKGROUND OF THE INVENTION

FIELD OF THE INVENTION

The invention relates to a method and an apparatus for monitoring a selected group of fuel cells of a fuel cell stack.

It is known that in the electrolysis of water, water molecules are decomposed by electrical current into hydrogen ($H_2$) and oxygen ($O_2$). In a fuel cell, that process takes place in reverse order. Electrochemically combining hydrogen ($H_2$) and oxygen ($O_2$) to form water creates electrical current at high efficiency and, if pure hydrogen ($H_2$) is used as a combustion gas, without emitting pollutants and carbon dioxide ($CO_2$). Even with an industrial combustion gas, such as natural gas or coal gas, and air (which may additionally be enriched with oxygen ($O_2$)), a fuel cell produces markedly less pollution and less carbon dioxide ($CO_2$) than other energy generators that use fossil fuels. The technical application of the principle of the fuel cell has lead to various devices, specifically with various kinds of electrolytes and with operating temperatures between 80° C. and 1000° C.

The fuel cells are classified depending on their operating temperature as low, medium and high-temperature fuel cells, which in turn differ as a result of various technical embodiments.

A high-temperature fuel cell stack (a fuel cell stack is also simply called a "stack" in the professional literature) composed of many high-temperature fuel cells, includes at least one protection layer, one contact layer, one electrolyte-electrode unit, a further contact layer, a further composite printed circuit board, and so forth, which are disposed in that order below an upper composite printed circuit board that covers the high-temperature fuel cell stack.

The electrolyte-electrode unit includes two electrodes and one solid electrolyte, disposed between the two electrodes and constructed as a diaphragm. Each electrolyte-electrode unit located between adjacent composite printed circuit boards, together with the contact layers immediately contacting both sides of the electrolyte-electrode unit, forms a high-temperature fuel cell, to which the sides of each of the two composite printed circuit boards contacting the contact layers also belong. That type of fuel cell and others are known, for instance, from the Fuel Cell Handbook by A. J. Appleby and F. R. Foulkes, 1989, pp. 440–454.

A stack of fuel cells as a rule has at least 50 cells. The stack must be monitored for the entire period of operation in order to detect whether and where a cell in the stack is defective. If a leak occurs, major damage to the system can in fact occur, and/or hydrogen gas can escape uncontrolled into the environment (leading to a risk of explosion). As a rule a fuel cell reacts immediately to a leak by reversing the polarization of its voltage so that such a state must therefore be detected quickly so that the affected cell can be turned off. It is not possible to monitor each cell individually due to the major technological effort and expense. For the sake of practical functional monitoring, a plurality of cells are each combined into one group, and individual groups are then compared with the other groups in the stack.

A method for functional or power monitoring of a plurality of cells electrically connected in series is known from European Patent Disclosure 0 486 654. In that method, the cells of the stack are first subdivided into groups. At a certain time, the electrical voltages of the groups are detected, and the standardized measured voltage of each group is compared with a first electrical reference voltage, which is equal to a predetermined minimum voltage. In addition, the voltages of the individual groups are compared with one another in various ways. In a first exemplary embodiment, the voltage of a selected group is compared with the voltages of each of the other groups. In a second exemplary embodiment, two adjacent groups are selected in succession and compared with one another. In a third exemplary embodiment, the total of the voltages of the individual fuel cell groups is formed and divided by the number of fuel cell groups. That value is then compared with each individual group. In the monitoring method, the voltages of the individual groups of cells are compared with one another in the most various ways within a predetermined monitoring interval. The method is thus based on many comparisons.

In a further known method, a threshold value for the electrical voltage is determined and is output as a function of the electrical current. The electrical voltages of the individual groups are then compared with the threshold value. Since the threshold value is ascertained from a current measurement value measured at a different time from the electrical voltages of the groups (the threshold value must first be calculated before the comparison), an error can occur if the threshold value and the electrical voltages of the groups pertain to different operating states of the stack.

SUMMARY OF THE INVENTION

It is accordingly an object of the invention to provide a method and an apparatus for monitoring a selected group of fuel cells of a high-temperature fuel cell stack, which overcome the hereinafore-mentioned disadvantages of the heretofore-known methods and apparatuses of this general type and which detect a failure of one fuel cell of a stack reliably and with simple measures.

With the foregoing and other objects in view there is provided, in accordance with the invention, a method for monitoring a selected group of fuel cells of a fuel cell stack, which comprises ascertaining a change over time in an averaged electrical voltage of the fuel cells of the selected group and comparing the change over time with a reference value encompassing at least a change over time in a voltage of other fuel cells.

Thus, the method is highly dynamic since changes in voltage over time are detected and compared, as compared with load changes in the stack. It is possible by using simple measures according to the method to reliably detect whether a cell of the selected group has failed or at least is not furnishing the proper voltage.

In accordance with another mode of the invention, all of the cells of the stack are divided into a plurality of groups of directly series-connected cells, and only the input voltage of the first cell of a group and the output voltage of the last cell of that one group are measured. The groups each have a number cells, for instance ten, the voltages of which are thus detected in groups, namely through the use of the voltage difference at the input and output of each group. There is no need to detect the electrical voltage of each individual cell in this group. The detection probability of the method suffices for groups with a relatively large number of cells.

In accordance with a further mode of the invention, the relative change in the difference between the input voltage of the first cell and the output voltage of the last cell can be ascertained as the change over time in the voltage of a group. The difference in the electrical voltage of this group can be detected at two different times, with the interval between these two times being 0.5 s, for instance.

In accordance with an added mode of the invention, the sum of the voltages of the cells is measured and divided by the number of cells, yielding the averaged voltage of the cells of the selected group. Independence from the group size (that is, the number of cells in the group) is attained by dividing the added-up voltage by the number of cells. The groups then need no longer all have the same number of cells.

In accordance with an additional mode of the invention, the reference value can encompass the voltages and their changes regarding all of the cells of the stack that do not belong to the selected group. This assures very reliable monitoring of the stack, since a defect in one cell of the selected group does not affect the reference value, and a defect in another cell only slightly adulterates the reference value.

In accordance with yet another mode of the invention, the averaged voltage of the selected group is additionally compared with a mean value that encompasses the voltages of all or at least of other cells of the stack. Reliable monitoring is assured by comparing the selected group with the mean value for the voltage, since a defective cell in the selected group has only a relatively weak effect on the mean value, or it has no effect at all if there are no cells in the selected group.

The method makes it possible to monitor all of the cells of the stack simultaneously, by monitoring each cell as a member of at least one selected group.

In accordance with yet a further mode of the invention, each cell of the stack is monitored redundantly as a member of at least two selected groups. The accuracy for locating any cell that has failed is increased by suitably dividing up the cells of the stack into groups.

In accordance with yet an added mode of the invention, the redundant monitoring can be carried out through the use of redundant processing devices for the measured voltages. If one processing device should fail, this hardware redundance nevertheless assures that the entire stack will be monitored.

With the objects of the invention in view, there is also provided an apparatus for monitoring series-connected fuel cells of a fuel cell stack, comprising at least two monitoring devices, wherein at a predetermined time, an electrical input voltage and output voltage of the entire stack is applied to each monitoring device; a plurality of voltages are applied to each monitoring device through pickups and signal inputs, the voltages are each picked up between adjacent fuel cells, and at least between two pickups that are applied to a monitoring device, at least one pickup has a signal line leading to a different monitoring device, and an arithmetic stage can be activated in each monitoring device for comparing a plurality of differences among the voltages applied at one time with corresponding differences applied at an earlier time.

The pickups correspond to a division of the cells into groups, and preferably, except for the two groups at the input and output of the stack, all of the groups have the same number of cells. The voltage difference picked up from one group furnishes the averaged voltage of the cells of this group, and the comparison of a voltage difference picked up at different times furnishes the change over time thereof.

The corresponding reference value with which the change in voltage of this group is compared may be formed from the changes in the other (or all of the) voltage differences being picked up. In order to provide redundant monitoring of the cells, an apparatus is advantageously obtained in which the series-connected fuel cells in the stack are monitored at a predetermined time through the use of at least two monitoring devices. Voltages are applied that are each picked up between adjacent fuel cells through the use of pickups and signal lines of each monitoring device. These pickups are disposed in such a way that at least for two pickups (preferably between each two pickups), which are connected to the one (first) monitoring device, another pickup is located for at least one further (and preferably for every further) monitoring device.

Each monitoring device includes an activatable arithmetic stage, which compares a plurality of differences in the voltages applied at one time with corresponding differences in voltages applied at an earlier time.

The pickups connected to the first device correspond to a first division of the cells of the stack into groups, and a group division in which the cells of one group are monitored jointly by the associated monitoring device belongs equally well to any other device. Even if every monitoring device is to monitor the first and last cells of the stack, still the input voltage and output voltage of the stack is applied to each monitoring device.

Other features which are considered as characteristic for the invention are set forth in the appended claims.

Although the invention is illustrated and described herein as embodied in a method and an apparatus for monitoring a selected group of fuel cells of a high-temperature fuel cell stack, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

The FIGURE of the drawing is a schematic and diagrammatic view of a fuel cell array with a fuel cell stack.

DETAILED DESCRIPTION OF THE
PREFERRED EMBODIMENTS

Referring now in detail to the single FIGURE of the drawing, there is seen a fuel cell array 2 with a fuel cell stack 4. The stack 4 contains 40 fuel cells (cells $b_1$–$b_{40}$). As a rule, one stack contains at least 50 cells.

The cells $b_1$–$b_{40}$ of the stack 4 are each combined into groups. A first group configuration 6 includes groups GA, GB, GC and GD, each of which contains ten series-connected cells. The group GA contains the cells $b_1$–$b_{10}$; the group GB contains the cells $b_{11}$–$b_{20}$; the group GC contains the cells $b_{21}$–$b_{30}$; and the group GD contains the cells $b_{31}$–$b_{40}$. A second group configuration 8 (that is, a further group configuration, which divides the cells $b_1$–$b_{40}$ differently than the first group configuration 6) includes groups Ga, Gb, Gc, Gd and Ge. The group Ga contains the cells $b_1$–$b_5$. The groups Gb, Gc and Gd contain the cells $b_6$–$b_{15}$, $b_{16}$–$b_{25}$, and $b_{26}$–$b_{35}$, respectively. The group Ge contains the cells $b_{36}$–$b_{40}$. Accordingly, each cell in each group configuration is a member of precisely one group.

The electrical voltages are detected in groups, specifically in groups Gi (where i stands for A, B, C, D, a, b, c, d and e). For each group Gi, the input voltage of the first cell (for instance, the input voltage of the cell $b_1$ for the group GA) and the output voltage of the last cell of this group Gi (that is, the output voltage of cell $b_{10}$ for the group GA) are measured.

The detected (measured) electrical voltages of the groups Gi are processed in two processing devices 10, 12. The processing device 10 has electrical signal inputs A–D. The processing device 12 has electrical signal inputs a–e. The respective electrical signal inputs A, B, C and D detect the electrical voltages of the respective groups GA, GB, GC, and GD of the first group configuration 6. The groups Ga, Gb, Gc, Gd and Ge of the second group configuration 8 are detected through the electrical signal inputs a, b, c, d and e of the processing device 12.

Each cell $b_1$–$b_{40}$ is thus a member of two groups Gi. One of the two groups Gi is assigned to the first group configuration 6, and the other of the two groups Gi is assigned to the second group configuration 8. It is thus assured that each cell $b_1$–$b_{40}$ is detected in terms of voltage in parallel by both processing devices 10, 12. The fuel cell array 2 is thus constructed in a redundant manner with regard to measurements of the electrical voltages of the cells $b_1$–$b_{40}$ (and thus of the groups Gi). The voltage pickup is effected through pickups 13 connected to electrical lines 14.

The groups Gi each contain ten cells, except for the groups Ga and Ge, each of which contain only five cells.

The apparatus can also be expanded to more than two simultaneously operating monitoring devices. Each cell in each monitoring device is monitored as a member of a selected group.

The electrical input voltage and output voltage of the stack 4 is applied to each monitoring device. As a result, in each device, the total voltage difference of the stack 4 is detected as a mean value, which pertains to all of the other cells of the stack, in addition to the voltages of the particular monitored, selected group. A plurality of pickups are disposed on the stack 4, each of which pick up the voltage at an electrical connection between two fuel cells and are simultaneously applied to a respective monitoring device 10, 12 in a cyclically alternating way: One further voltage pickup is provided for the monitoring device 12 and every other monitoring device, between two of these pickups, which are assigned to one monitoring device (for instance the monitoring device 10 in the drawing). For instance, in order to monitor the cell $b_6$, the cells $b_1$–$b_{10}$ are combined in the device 10 into the selected group for this cell $b_6$ and detected as a group at the signal input A. Conversely, in the monitoring device 12, the cells $b_6$–$b_{15}$ form a group selected for the cell $b_6$, the voltages of which are detected jointly at the input b. Correspondingly, even further breakdowns of the stack 4 into individual groups can be made, so that the cell $b_6$ is also a member of a correspondingly selected group for every other monitoring device.

The cell $b_6$ is accordingly monitored redundantly, depending on the number of monitoring devices. The monitoring of the cell $b_6$ through the use of the signal input A (or b) and through the use of a voltage picked up as a reference value for the monitoring at the two ends of the stack 4, will be described precisely below.

At the same time, however, the voltages of the other groups are monitored correspondingly redundantly. The cell $b_{16}$, for instance, is a member of the group $b_{11}$–$b_{20}$, the voltages of which are combined at the signal input B and which form the group selected for monitoring the cell $b_{16}$.

Accordingly, as a result of this group configuration, each cell is a member of a selected group (in the case of a single monitoring device) or of a respective selected group, each one specifically provided for each monitoring device. Since all of the groups are monitored by each monitoring device simultaneously according to the method of the invention, all of the cells are accordingly monitored simultaneously and redundantly in the apparatus shown in the drawing. In order to monitor a cell $b_i$ (for instance, $b_{16}$) in a monitoring device (for instance the device 10), a selection is accordingly made of the group $G_i$, to which $b_i$ belongs (that is, the group GB for the cell $b_{16}$). The change over time of the averaged electrical voltage of the directly series-connected cells $b_{11}$–$b_{20}$ (that is, of the group GB selected for the cell $b_{16}$) is ascertained and compared with a reference value which encompasses the measured electrical voltages of other cells (that is, for instance, all of the cells $b_1$–$b_{40}$ of the stack 4, or at least cells other than the cells $b_{11}$–$b_{20}$ of the group GB) and their changes over time.

The averaged voltage of the cells in the selected group $G_i$ and in the entire stack is represented by $\overline{U}_i$ and $\overline{U}_o$:

$$\overline{U}_i = U_i/n_i \text{ and } \overline{U}_o = U_o/n_o$$

in which $U_i$ is the voltage at the corresponding signal input of the monitoring device 10, 12, $U_o$ is the difference between the output voltage and the input voltage of the stack 4, and $n_i$, $n_0$ is the number of cells in the selected group $G_i$ and in the entire stack 4. This takes into account the fact that $n_i$ can be different for the various individual groups. The variables $U_i$ and $U_o$ are each measured at successive times as $U_{i,0}(t)$ and $U_{i,0}(t')$. The relative total voltage of the selected group $G_i$ is $$U_i(\text{rel}) = \overline{U}_i / \overline{U}_0.$$

A difference formed in accordance with different variants between the voltages measured at the times is formed as the change over time in the averaged electrical voltage at the cells of the selected group $G_i$ and compared with the reference value DB, which is preferably ascertained from the total voltage $U_o$ and its change between the times $t_i$ and $t_i'$:

$$DB = \frac{\sum U_i(t') - \sum U_i(t)}{\sum U_i(t)} = \frac{\overline{U}_o(t') - \overline{U}_o(t)}{\overline{U}_o(t)}$$

(relative change in the total voltage of all groups $G_i$) or $$DB = \sum \frac{U_i(t') - U_i(t)}{U_i(t)}$$

(sum of the relative changes in the individual group voltages).

A change $\Delta i$ of the averaged voltage can likewise be calculated for the group $G_i$ selected for the cell $b_i$ from $$\Delta i = \frac{\overline{U}_i(t') - \overline{U}_i(t)}{\overline{U}_o(t)} \cdot 100$$

(or preferably:

$$\Delta i = \frac{U_i(t') - U_i(t)}{U_i(t)} \cdot 100)$$

(in each case in percent).

The criterion for properly functioning cells in the selected group $G_i$ is then:

$|\Delta i| < R \cdot |DB|,$ in which R is a fixedly predetermined limit value (such as 50%).

As a dynamic method, in which the change in a group voltage is compared with the changes in the voltages of other (or all of the) groups, this monitoring is sensitive to rapid changes if one fuel cell fails, but insensitive to "creeping" changes, in which the voltage of one cell changes slowly. In contrast to this method, known static methods of the kind described at the outset and based on a comparison of the group voltage itself with the voltages of other (or all of the) groups, are not sensitive to voltage changes until a considerable change in the group voltage builds up over the course of time.

Therefore, both monitoring concepts are preferably combined. Then, not only is the averaged voltage of the cells in the selected group compared with a voltage reference value formed from other groups (or all of the groups), but the changes in the variable are also compared. This leads, for instance, to an additional criterion $|\overline{U}_i(t') - \overline{U}_o(t')| < Q$ with a corresponding limit value Q (such as 100 mV), or $$\frac{|\overline{U}_i(t') - \overline{U}_o(t)|}{|\overline{U}_o(t')|} \cdot 100 < Q$$

(such as Q=20%).

In this way, rapid voltage changes, of the kind that can arise if a leak occurs, and gradual changes caused by gradual failure of components can be detected simultaneously for the cells of each monitored (selected) group $G_i$.

We claim:

1. In a method for monitoring a selected group of fuel cells of a fuel cell stack, the improvement which comprises:
    ascertaining a change over time in an averaged electrical voltage of the fuel cells of the selected group and comparing the change over time with a reference value encompassing at least a change over time in a voltage of other fuel cells of the fuel cell stack.

2. The method according to claim 1, which comprises:
    subdividing all of the cells of the stack into a plurality of groups of fuel cells connected directly in series;
    ascertaining the averaged voltage in the other fuel cells when the change over time in the averaged electrical voltage in the selected group is ascertained; and
    forming a mean voltage of one group in each case from only a measured voltage between the electric input and the electric output of the one group at two successive times.

3. The method according to claim 2, which comprises ascertaining a relative change in the difference between the input voltage of the first fuel cell and the output voltage of the last fuel cell of the one group, as a change over time in the voltages of the one group.

4. The method according to claim 1, which comprises measuring a total voltage of the fuel cells of the selected group and dividing the total voltage by the number of fuel cells, as the averaged voltage of the fuel cells of the selected group.

5. The method according to claim 1, which comprises ascertaining a relative change in a measured total voltage of the fuel cells of the selected group, as a change in the averaged electrical voltage of the fuel cells of the selected group.

6. The method according to claim 1, which comprises encompassing at least the voltages of all fuel cells not belonging to the selected group, and their changes, in the reference value.

7. The method according to claim 1, which comprises ascertaining a sum of relative changes of the measured voltages as the reference value.

8. The method according to claim 1, which comprises ascertaining a relative change in a sum of the measured voltages as the reference value.

9. The method according to claim 1, which comprises additionally comparing the averaged voltage of the selected group with a mean value encompassing the voltage of all of the fuel cells.

10. The method according to claim 1, which comprises additionally comparing the averaged voltage of the selected group with a mean value encompassing the voltage of at least different fuel cells in the stack.

11. The method according to claim 1, which comprises simultaneously detecting the voltages of all of the fuel cells of the stack, and monitoring each fuel cell as a member of the selected group.

12. The method according to claim 1, which comprises redundantly monitoring each fuel cell of the stack as a member of at least two selected groups.

13. The method according to claim 12, which comprises performing the redundant monitoring by redundant monitoring devices for the measured voltages.

14. In an apparatus for monitoring series-connected fuel cells of a fuel cell stack, the improvement comprising:
    a) pickups associated with the fuel cells;
    b) signal lines connected to said pickups; and
    c) at least two monitoring devices having signal inputs connected to said signal lines,
    each of said monitoring devices operating at a predetermined time for receiving an electrical input voltage and output voltage of the entire stack and for receiving a plurality of voltages picked up between adjacent fuel cells through said pickups and signal inputs,
    at least one of said pickups between at least two of said pickups applied to one of said monitoring devices being connected to one of said signal lines leading to another of said monitoring devices, and
    each of said monitoring devices having an arithmetic stage to be activated for comparing a plurality of differences among the voltages applied at one time with corresponding differences applied at an earlier time.

15. The apparatus according to claim 14, wherein two of said pickups both connect to a first monitoring device and a third pickup is disposed between said two of said pickups, said third pickup connecting to every monitoring device other than said first monitoring device.

* * * * *